(12) United States Patent
Kwon (10) Patent No.: US 9,362,502 B2
(45) Date of Patent: Jun. 7, 2016

(54) DONOR SUBSTRATE FOR TRANSFER AND MANUFACTURING METHOD OF ORGANIC LIGHT EMITTING DIODE DISPLAY

(71) Applicant: SAMSUNG DISPLAY CO., LTD., Yongin, Gyeonggi-Do (KR)

(72) Inventor: Young-Gil Kwon, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 6 days.

(21) Appl. No.: 14/192,694

(22) Filed: Feb. 27, 2014

(65) Prior Publication Data

US 2015/0031156 A1   Jan. 29, 2015

(30) Foreign Application Priority Data

Jul. 25, 2013  (KR) .................. 10-2013-0088136

(51) Int. Cl.
| | | |
|---|---|---|
| *H01L 51/56* | (2006.01) | |
| *H01L 27/32* | (2006.01) | |
| *H01L 51/00* | (2006.01) | |
| *B41M 5/42* | (2006.01) | |

(Continued)

(52) U.S. Cl.
CPC ............. *H01L 51/0013* (2013.01); *B41M 5/42* (2013.01); *H01L 27/3211* (2013.01); *H01L 51/56* (2013.01); *B41M 5/38214* (2013.01); *B41M 5/465* (2013.01); *B41M 2205/02* (2013.01); *B41M 2205/30* (2013.01); *B41M 2205/38* (2013.01); *C23C 14/048* (2013.01); *Y02E 10/549* (2013.01)

(58) Field of Classification Search
CPC ................ B41M 2205/02; B41M 2205/38; B41M 5/42; B41M 5/38214; C23C 14/048; H01L 2221/68368; H01L 51/0013; H01L 51/56; H01L 27/3211
See application file for complete search history.

(56) References Cited

U.S. PATENT DOCUMENTS

| 7,993,806 B2* | 8/2011 | Takagi ................ H01L 51/0013 430/199 |
|---|---|---|
| 2005/0196526 A1* | 9/2005 | Ishida ................. H01L 51/5278 427/66 |

(Continued)

FOREIGN PATENT DOCUMENTS

| KR | 10-0873071 | 12/2008 |
|---|---|---|
| KR | 10-2009-0077928 | 7/2009 |
| KR | 10-2012-0138691 | 12/2012 |

OTHER PUBLICATIONS

Davis, et al., Enhanced Adhesion of Elastic Materials to Small-Scale Wrinkles, Langmuir, ACS Publication, 2012, 14899-1490, American Chemical Society, 10 pages.

*Primary Examiner* — Marvin Payen
*Assistant Examiner* — Jeremy Joy
(74) *Attorney, Agent, or Firm* — Lewis Roca Rothgerber Christie LLP (57) ABSTRACT

A donor substrate for transfer is disclosed. In some embodiments, the donor substrate for transfer includes a base layer, a light-heat conversion layer on the base layer, an intermediate layer on the light-heat conversion layer, and a transfer layer on the intermediate layer, in which the intermediate layer includes a transfer part and a non-transfer part, and in the transfer part and the non-transfer part, surface roughness of the intermediate layer is in a range of 30 nanometers or more and 1 micrometer or less. Methods of manufacturing an organic light emitting diode display are also disclosed.

6 Claims, 9 Drawing Sheets

(51) Int. Cl.
   *C23C 14/04*   (2006.01)
   *B41M 5/382*   (2006.01)
   *B41M 5/46*    (2006.01)

(56) References Cited

U.S. PATENT DOCUMENTS

| | | | | |
|---|---|---|---|---|
| 2005/0233504 A1* | 10/2005 | Doi | ............... | H01L 21/6835 438/127 |
| 2006/0246240 A1* | 11/2006 | Matsuda | ............ | H01L 51/0013 428/32.39 |
| 2007/0052353 A1* | 3/2007 | Yang | ............... | H01L 51/0013 313/506 |
| 2008/0018239 A1* | 1/2008 | Matsuda | ............... | C09K 11/06 313/504 |
| 2008/0108157 A1* | 5/2008 | Matsuda | ............ | H01L 27/3211 438/22 |
| 2008/0124647 A1* | 5/2008 | Matsuda | ............ | B41M 5/38214 430/270.1 |
| 2008/0233827 A1* | 9/2008 | Kagami | ............ | H01L 51/0013 445/24 |
| 2009/0045735 A1* | 2/2009 | Matsunami | ......... | H01L 51/0013 313/504 |
| 2009/0269509 A1* | 10/2009 | Yokoyama | ............ | C23C 14/12 427/554 |
| 2009/0305445 A1* | 12/2009 | Ikeda | ............... | H01L 51/0013 438/29 |
| 2010/0087045 A1* | 4/2010 | Shimomura | ...... | H01L 21/76254 438/458 |
| 2010/0098879 A1* | 4/2010 | Yokoyama | ......... | H01L 51/0003 427/553 |
| 2012/0086330 A1* | 4/2012 | Umeda | ............ | H01L 51/0013 313/504 |
| 2012/0097926 A1* | 4/2012 | Park | ............... | H01L 51/0013 257/40 |
| 2013/0175550 A1* | 7/2013 | Song | ............... | H01L 51/0013 257/88 |
| 2014/0117339 A1* | 5/2014 | Seo | ............... | H01L 51/504 257/40 |
| 2014/0127843 A1* | 5/2014 | Lee | ............... | H01L 27/3244 438/34 |

* cited by examiner

DONOR SUBSTRATE FOR TRANSFER AND MANUFACTURING METHOD OF ORGANIC LIGHT EMITTING DIODE DISPLAY

CROSS-REFERENCE TO RELATED APPLICATION

This application claims priority to and the benefit of Korean Patent Application No. 10-2013-0088136, filed in the Korean Intellectual Property Office on Jul. 25, 2013, the entire content of which is incorporated herein by reference.

BACKGROUND

1. Field

Aspects of embodiments of the present invention relate to a donor substrate for transfer (e.g., transfer of a transfer layer) and a method of manufacturing an organic light emitting diode display.

2. Description of the Related Art

An organic light emitting diode display includes two electrodes and an organic light emitting member therebetween. Electrons injected from one electrode and holes injected from the other electrode couple with each other in the organic light emitting member to form excitons. The excitons discharge energy, and light is emitted.

In order to provide layers that emit different colors in such an organic light emitting diode display, red, green, and blue light emitting layers can be formed using a laser induced thermal imaging method using a laser.

Such a laser induced thermal imaging method can include a method of forming a light emitting layer in the organic light emitting diode display by irradiating a laser beam onto a base film and a donor film. The donor film acts as a transfer layer to transfer a part of the transfer layer to the organic light emitting diode display, and each light emitting layer may be finely patterned.

In order to transfer the transfer layer well, a technique of minimizing (or reducing) surface energy and surface roughness of a layer that is below the transfer layer is applied, but in this case, minimizing (or reducing) the surface energy and surface roughness of the layer may result in a defect in which a transfer material that is not intended to be transferred is smeared up to a portion of the organic light emitting diode display.

The above information disclosed in this Background section is only for enhancement of understanding of the background of the invention and therefore it may contain information that does not form the prior art that is already known in this country to a person of ordinary skill in the art.

SUMMARY

Aspects of embodiments of the present invention have been provided in an effort to provide a donor substrate for transfer (e.g., transfer of a transfer layer) and a method of manufacturing an organic light emitting diode display capable of preventing (or reducing the occurrence of) a transfer defect.

According to an embodiment of the present invention, a donor substrate for transfer includes: a base layer; a light-heat conversion layer on the base layer; an intermediate layer on the light-heat conversion layer; and a transfer layer on the intermediate layer, in which the intermediate layer includes a transfer part and a non-transfer part, and in the transfer part and the non-transfer part, a surface roughness of the intermediate layer is in a range of about 30 nanometers or more and about 1 micrometer or less.

The surface roughness of the intermediate layer in the transfer part may be the same as the surface roughness of the intermediate layer in the non-transfer part.

The intermediate layer may include a UV curable material.

The transfer layer may include an organic light emitting material.

The transfer part may be a region to which light is irradiated in a pattern.

The light-conversion layer may be configured to convert light to heat energy.

The non-transfer part may be a region of the intermediate layer where light for inducing the light-heat conversion layer to convert the light to heat energy is not irradiated.

According to another embodiment of the present invention, a manufacturing method of an organic light emitting diode display includes: providing a light-heat conversion layer on a base layer; providing an intermediate layer including a transfer part and a non-transfer part, and having a surface roughness in the transfer part and the non-transfer part, on the light-heat conversion layer; providing a transfer layer on the intermediate layer; providing a transfer substrate including a region where the transfer layer is to be transferred, the transfer substrate facing transfer layer of a donor substrate including the base layer, the intermediate layer, and the transfer layer; irradiating light to the donor substrate to reduce the surface roughness of the intermediate layer in the transfer part; and transferring the transfer layer to the transfer substrate.

The irradiating of the light to the donor substrate may include irradiating the light in a pattern defined by using a mask.

After the irradiating of the light to the donor substrate, the surface roughness of the intermediate layer in the transfer part and the surface roughness of the intermediate layer in the non-transfer part may be different from each other.

The surface roughness of intermediate layer in the transfer part may be less than the surface roughness of the intermediate layer in the non-transfer part.

In the providing of the intermediate layer having the surface roughness, in the transfer part and the non-transfer part, the intermediate layer may be provided so that the surface roughness of the intermediate layer may be in a range of about 30 nanometers or more and about 1 micrometer or less.

The intermediate layer may include a UV curable material.

The irradiating of the light to the donor substrate may include irradiating the light to a portion of the light-heat conversion layer corresponding to the transfer part, and not irradiating the light to a portion of the light-heat conversion layer corresponding to the non-transfer part.

The portion of the light-heat conversion layer corresponding to the transfer part may convert the light to heat energy.

The heat energy may be transferred to the intermediate layer to reduce the surface roughness of the intermediate layer in the transfer part.

The providing of the intermediate layer may include: providing a UV curable material on the light-heat conversion layer; applying a master pattern having a set surface roughness to the UV curable material; applying heat and pressure to the UV curable material to form a surface roughness in the UV curable material matching the set surface roughness; and UV curing the UV curable material.

According to the embodiments of the present invention, it is possible to have a high transfer selection ratio between a transfer part and a non-transfer part by forming the transfer part and the non-transfer part to have surface a roughness of a predetermined (or set) value and reducing the surface roughness of the transfer part due to an ironing effect. Therefore, it is possible to transfer a transfer material in the transfer part well and prevent the transfer material from being smeared in the non-transfer part (or reduce the amount or likelihood of the transfer material being smeared in the non-transfer part).

BRIEF DESCRIPTION OF THE DRAWINGS

The accompanying drawings, together with the specification, illustrate embodiments of the present invention, and, together with the description, serve to explain the principles of the present invention.

DETAILED DESCRIPTION

Hereinafter, certain embodiments of the present invention will be described in detail with reference to the accompanying drawings, by way of illustration. As those skilled in the art would realize, the described embodiments may be modified in various different ways, all without departing from the spirit or scope of the present invention. On the contrary, the embodiments introduced herein are provided to make disclosed contents thorough and complete and sufficiently transfer the spirit of the present invention to those skilled in the art.

In the drawings, the thicknesses of layers, films, panels, regions, etc., may be exaggerated for clarity. It will be understood that when a layer is referred to as being "on" another layer or substrate, it can be directly on the other layer or substrate, or it can be indirectly on the other layer or substrate with one or more intervening elements interposed therebetween. Like reference numerals designate like elements throughout the specification. Expressions such as "at least one of," when preceding a list of elements, modify the entire list of elements and do not modify the individual elements of the list. Further, the use of "may" when describing embodiments of the present invention refers to "one or more embodiments of the present invention."

Figure 1:
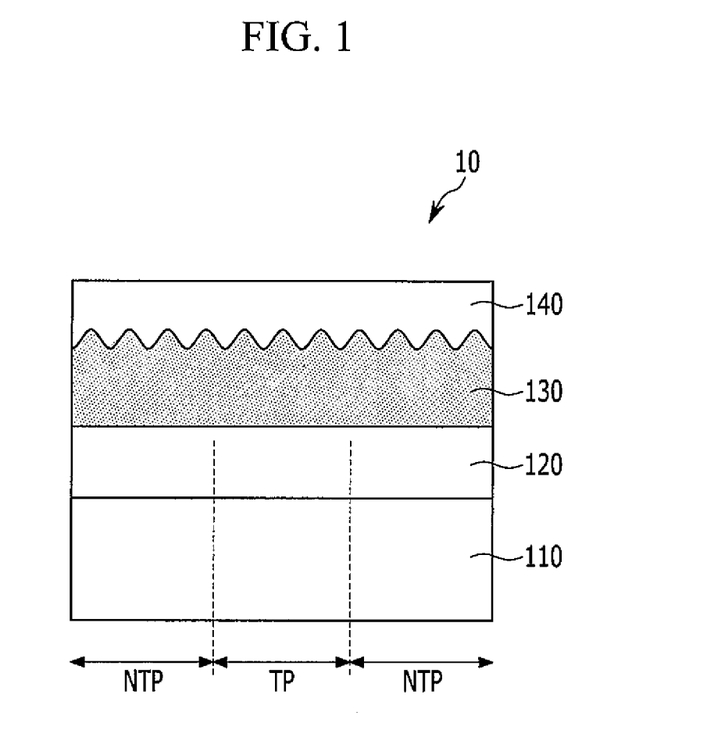
FIG. 1 is a cross-sectional view illustrating a donor substrate for transfer according to an embodiment of the present invention.

FIG. 1 is a cross-sectional view illustrating a donor substrate for transfer according to an embodiment of the present invention.

Referring to FIG. 1, a donor substrate 10 according to an embodiment of the present invention includes a light-heat conversion layer 120 on a base layer 110, an intermediate layer 130 on the light-heat conversion layer 120, and a transfer layer 140 on the intermediate layer.

The base layer 110 may include a material having a high light transmitting property (high light transmittance), for example, glass and/or a transparent polymer material such as polyethylene terephthalate (PET), polyethylene naphthalate (PEN), polyethylene (PE), or polycarbonate (PC).

In some embodiments, the light-heat conversion layer 120 converts incident light into heat, and, for example, may include a metal material having high light absorption, such as chromium (Cr), molybdenum (Mo), titanium (Ti), tungsten, aluminum oxide, aluminum sulfide, or an alloy including the same. Further, the light-heat conversion layer 120 may include carbon (C) and/or an infrared dye.

The intermediate layer 130 on the light-heat conversion layer 120 may prevent (or reduce the likelihood of) a light-heat conversion material of the light-heat conversion layer 120 from being transferred together with the transfer layer 140 when the transfer layer 140 is transferred by heat generated from the light-heat conversion layer 120. The intermediate layer 130 may also prevent (or reduce the likelihood of) the transfer layer 140 from being burned by heat when the heat generated from the light-heat conversion layer 120 is transferred to the transfer layer 140.

In some embodiments, the intermediate layer 130 includes a UV curable resin (e.g., any suitable resin or material curable by ultraviolet light), and separates the transfer layer 140 from a remaining portion of the donor substrate 10. In the related art, a layer related to the intermediate layer 130 is formed to minimize (or reduce) surface energy and surface roughness of that layer so that a layer related to the transfer layer 140 is separated from that layer well. However, as a result, in a non-transfer part (which does not need to be transferred (and is not intended to be transferred) in an actual transfer process), a defect may occur in which a transfer material of the non-transfer part is smeared on a transfer substrate.

The surface of the intermediate layer 130 according to one embodiment has surface roughness in a range of approximately 30 nanometers or more and 1 micrometer or less. Here, in this embodiment, the surface roughness is a value calculated by a root mean square. For example, the surface roughness may be the root mean square of the heights and depths of deviations from the mean line (e.g., the mean elevation of the profile of the surface). In addition, a transfer part TP and a non-transfer part NTP of the donor substrate 10 may have surface roughness in the aforementioned range. Further, in some embodiments, the surface roughness of the transfer part TP and the surface roughness of the non-transfer part NTP may be the same as each other. For example, the surface roughness of the intermediate layer in the transfer part TP may be the same as the surface roughness of the intermediate layer of the non-transfer part NTP. The transfer part TP is a region where patterned light is irradiated (e.g., a region to which a pattern of light is irradiated to induce the light-heat conversion layer 120 to convert the light to heat energy). In some embodiments, the non-transfer part NTP is a region to which light for inducing the light-heat conversion layer 120 to generate heat energy is not irradiated.

In a donor substrate in the related art, surface roughness of a layer related to the intermediate layer 130 represents a root mean square of approximately 0.5 nanometers to 2 nanometers. However, in the case where the surface roughness of the intermediate layer is less than 30 nanometers, a possibility of an occurrence of a defect in which the transfer material is smeared on the transfer substrate up to the non-transfer part may increase. When the surface roughness of the intermediate layer is larger than 1 micrometer, a possibility that a portion of the intermediate layer protruding from the surface of the intermediate layer acts as a defect (or creates a defect) during the transfer process is increased.

Accordingly, like the above-described embodiment of the present invention, when the surface roughness of the intermediate layer 130 is in a range of 30 nanometers or more and 1 micrometer or less, the transfer material in the non-transfer part may be prevented from being smeared on the transfer substrate (or the likelihood of the transfer material in the non-transfer part being smeared on the transfer substrate may be reduced), and the transfer material in the transfer part may be easily transferred by an ironing process occurring during the transfer process, which is described in more detail below. Hereinafter, the ironing process will be described together with the description of the method of manufacturing an organic light emitting diode display.

In some embodiments, the transfer layer 140 is separated from the intermediate layer 130 as a result of heat energy supplied from the light-heat conversion layer 120, and the transfer layer 140 is transferred to the transfer substrate. The transfer layer 140 may include an organic light emitting material.

In another embodiment, the transfer layer 140 may be formed to include the same material as any one of a hole injection layer, a hole transporting layer, an electron transporting layer, and an electron injection layer. In this case, any one of the hole injection layer, the hole transporting layer, the electron transporting layer, and the electron injection layer may be formed on (or transferred to) the transfer substrate by using the donor substrate 10 for transfer.

FIGS. 2 to 8 are cross-sectional views illustrating a method of manufacturing an organic light emitting diode display according to an embodiment of the present invention.

Figure 2:
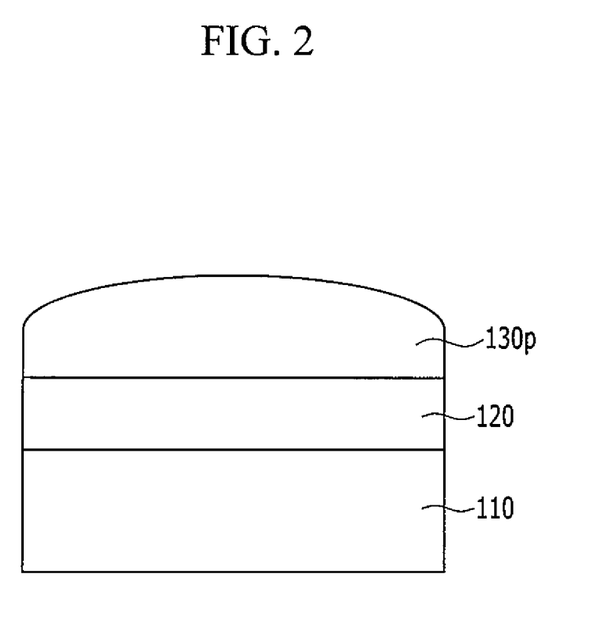
FIGS. 2 to 8 are cross-sectional views illustrating a manufacturing method of an organic light emitting diode display according to an embodiment of the present invention.

Referring to FIG. 2, a light-heat conversion layer 120 is formed (or provided) on a base layer 110. The light-heat conversion layer 120 may be formed on the base layer 110 through a coating process and the like. A UV curable material 130p (e.g., any suitable resin or material curable by ultraviolet light) is coated on the light-heat conversion layer 120.

Figure 3:
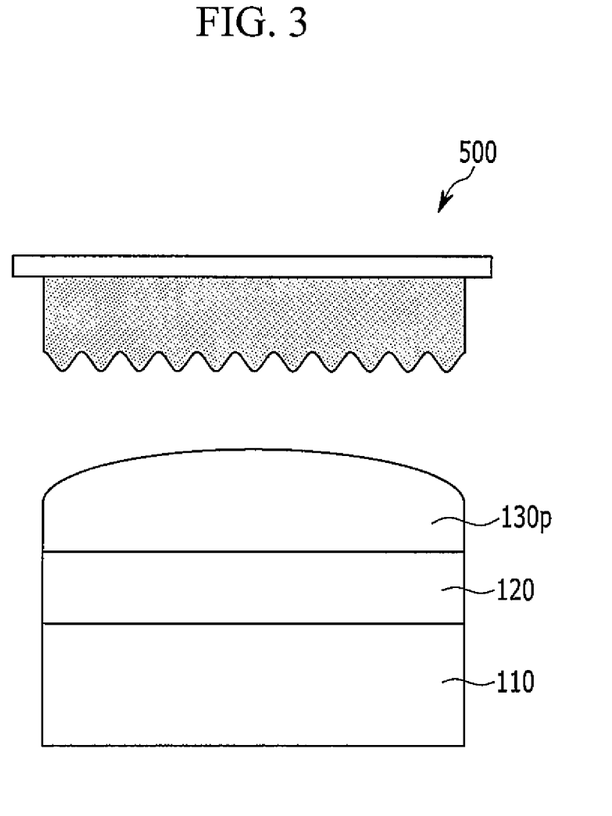
Figure 4:
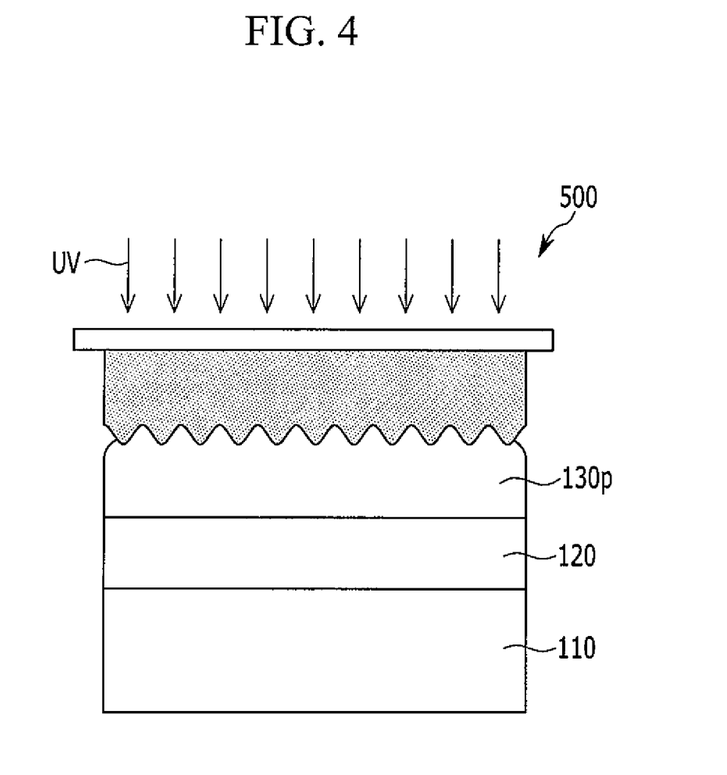
Figure 5:
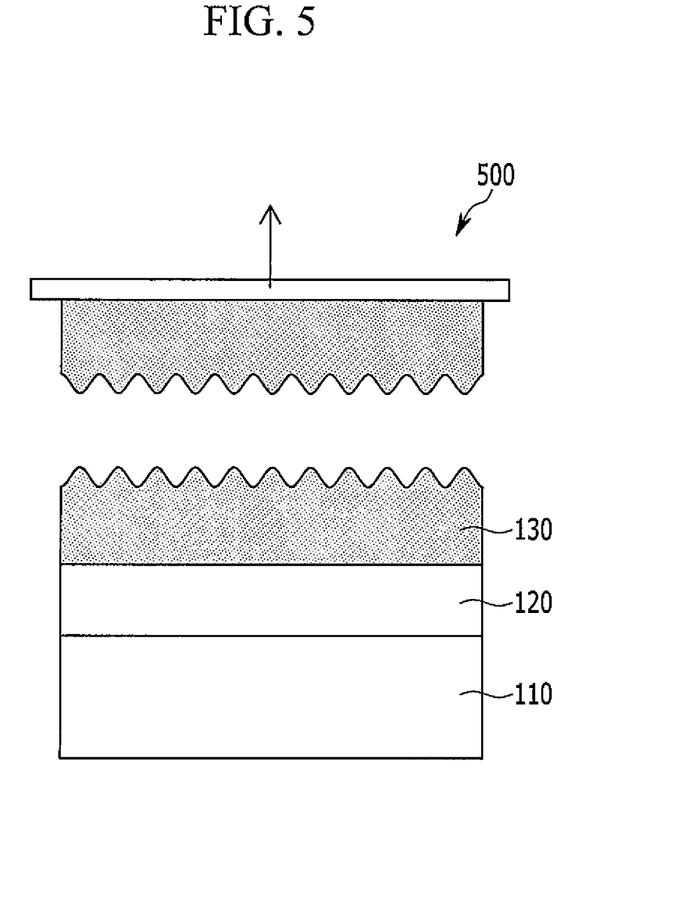

Referring to FIGS. 3 and 4, a master pattern 500 having a wrinkle (e.g., surface roughness) is disposed on (or applied to) the UV curable material 130p, and the UV curable material 130p is molded by applying heat and pressure. Thereafter, when UV curing is performed, the wrinkle (e.g., surface roughness) of the master pattern 500 is transferred to the UV curable material 130p and, thus, an intermediate layer 130 having a wrinkle (e.g., surface roughness) is formed (e.g., remains) when the master pattern 500 is removed as shown in FIG. 5. Here, the wrinkle (e.g., surface roughness) represents a protruding portion that protrudes from a surface of the master pattern 500 and can enlarge (or increase) surface roughness of the UV curable material 130p.

Figure 6:
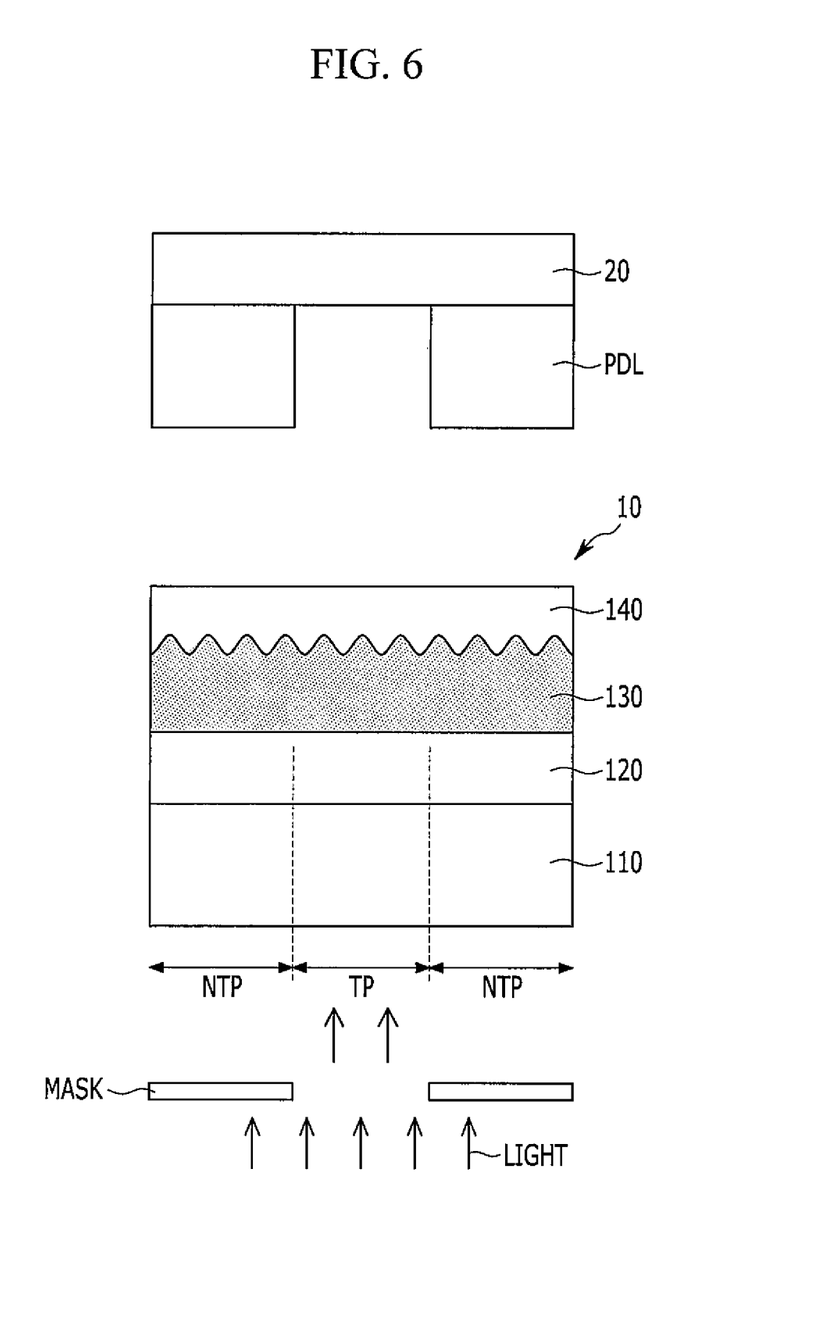

Referring to FIG. 6, the transfer layer 140 is formed (or provided) on the intermediate layer 130 having the wrinkle (e.g., surface roughness). Thereafter, a pixel defining layer (PDL) is formed (or provided) on the transfer substrate 20, and the pixel defining layer (PDL) partitions a pixel area. A pixel electrode may be formed (or provided) in the pixel area.

The donor substrate 10 and the transfer substrate 20 are arranged so that the transfer layer 140 of the donor substrate corresponds to the pixel area of the transfer substrate 20. Thereafter, light generated from a light emitting part (e.g., a light emitter) is irradiated onto the donor substrate 20. The light is irradiated to the base layer 110 of the donor substrate 10. In this case, by patterning the light by using a mask (e.g., forming a pattern of light using the mask), the light may be selectively irradiated to the transfer part TP of the donor substrate 10.

Figure 7:
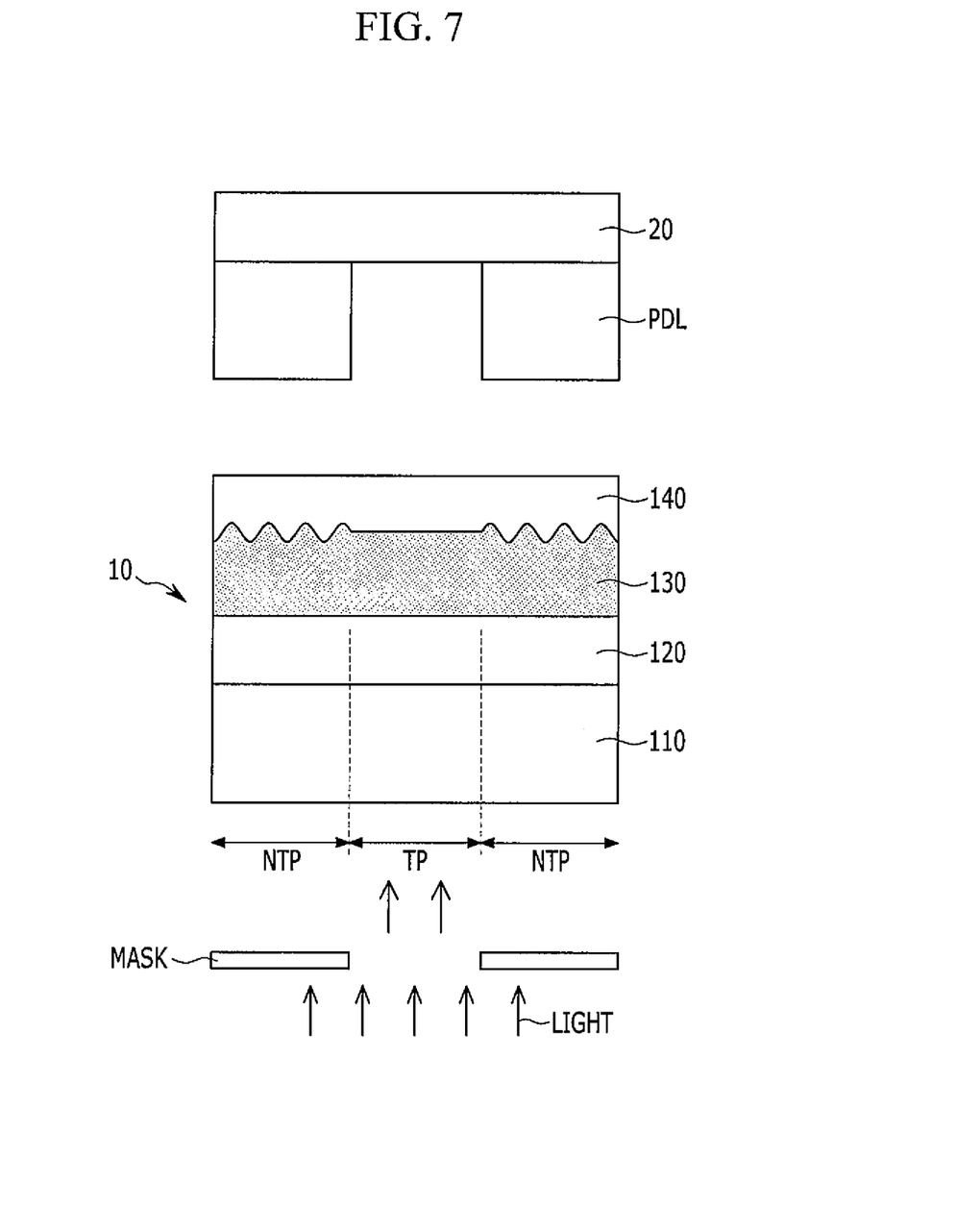

Referring to FIG. 7, when the light is selectively irradiated to the transfer part TP, heat energy is generated from (or at) a portion of the light-heat conversion layer 120 corresponding to the transfer part TP, and in the transfer part TP of the intermediate layer 130, the surface roughness is reduced by an ironing effect due to the heat energy. For example, the selectively irradiated light may be light that is configured to induce the light-heat conversion layer 120 to convert the light to heat energy, and the heat energy may cause the transfer part TP of the intermediate layer 130 to increase in temperature, thereby reducing the viscosity of the transfer part TP of the intermediate layer 130 (e.g., by exceeding the glass transition temperature or melting) and allowing the transfer part TP of the intermediate layer 130 to flow and decrease in surface roughness. In FIG. 7, since a portion of the surface of the intermediate layer 130 is expressed to be flat (or substantially flat), it is illustrated that the surface roughness of the transfer part TP of the intermediate layer 130 is reduced (relative to the non-transfer part NTP of the intermediate layer 130). In this case, the non-transfer part NTP of the intermediate layer 130 maintains inherent surface roughness (e.g., the surface roughness provided by the master pattern 500). Although the surface roughness of the non-transfer part NTP of the intermediate layer 130 may be slightly reduced relative to the corresponding surface roughness prior to the selective irradiation of light, the reduction degree may be much smaller than a reduction degree of the surface roughness of the transfer part TP of the intermediate layer 130. Accordingly, while the transfer layer 140 is transferred in the transfer part TP well, high adherence between the intermediate layer 130 and the transfer material is maintained in the non-transfer part NTP to prevent the transfer material from being smeared on the transfer substrate 20.

Figure 8:
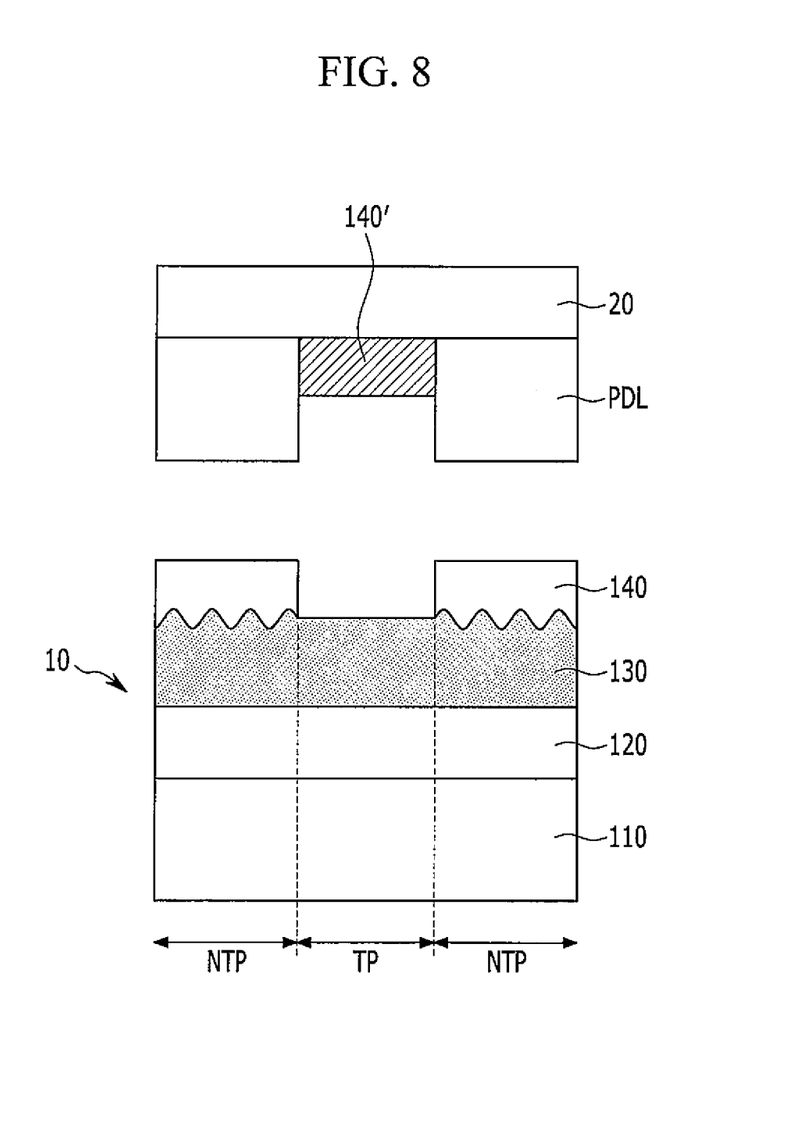

Referring to FIG. 8, when the light passes through the light-heat conversion layer 120 (or is absorbed by the light-heat conversion layer 120), light energy is converted into heat energy, and, in this case, a material of the transfer layer 140 is separated from the intermediate layer 130 by the converted heat energy, and material is transferred to the transfer substrate 20. As illustrated in FIG. 8, a light emitting layer 140' may be formed (or transferred to be) between the pixel defining layers PDL. In the present disclosure, although described as a light emitting layer, the transfer layer 140 may be a different kind of layer other than a light emitting layer may be formed.

Figure 9:
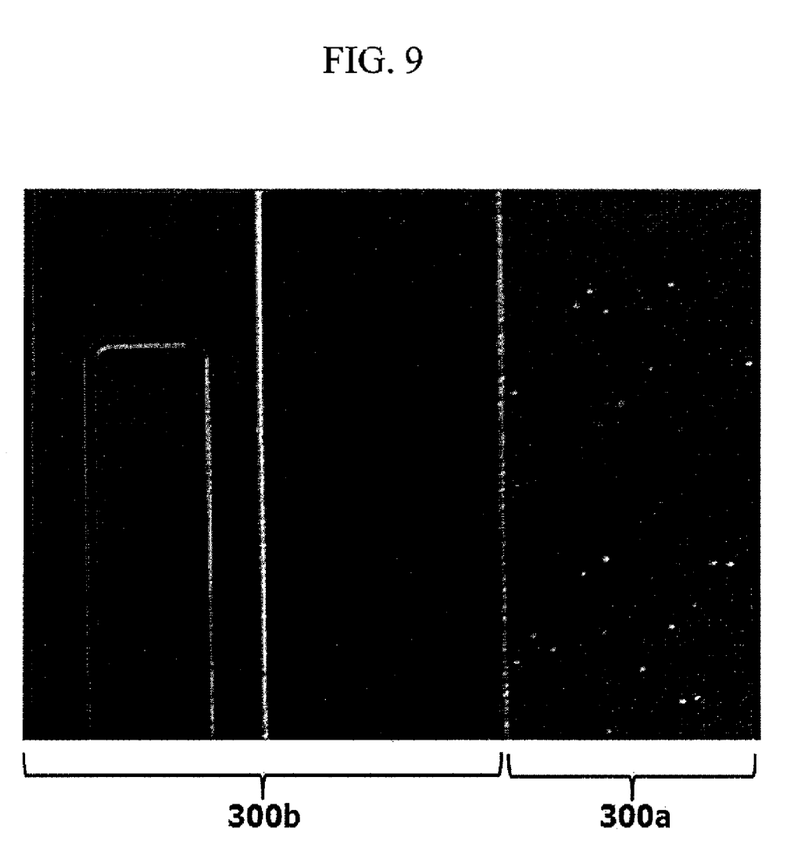
FIG. 9 is a scanning electron microscope (SEM) photograph illustrating surfaces of a donor substrate for transfer before and after transferring according to an embodiment of the present invention.

FIG. 9 is a scanning electron microscope (SEM) photograph showing surfaces before and after transferring in a donor substrate for transfer according to an embodiment of the present invention.

Referring to FIG. 9, an intermediate layer surface 300a before a light irradiating process and an intermediate layer surface 300b after a light irradiating process are shown. In FIG. 9, the intermediate layer surface 300a before a light irradiating process in which a height of a wrinkle (e.g., surface roughness) formed by using a master pattern is approximately 1 micrometer may be measured, and it can verified that the wrinkle (e.g., surface roughness) may be removed by the ironing effect when viewing the intermediate layer surface 300b after a light irradiating process.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims, and equivalents thereof.

| Description of some of the symbols | |
| --- | --- |
| 10: Donor substrate | 20: Transfer substrate |
| 110: Base layer | 120: Light-heat conversion layer |
| 130: Intermediate layer | 140: Transfer layer |

What is claimed is:

1. A donor substrate for transfer, comprising:
a base layer;
a light-heat conversion layer on the base layer;
an intermediate layer on the light-heat conversion layer; and
a transfer layer on the intermediate layer, wherein the intermediate layer comprises a transfer part and a non-transfer part, and in the non-transfer part, a surface roughness of the intermediate layer is in a range of about 30 nanometers or more and about 1 micrometer or less, and wherein the surface roughness in the transfer part is reduced when light is selectively irradiated to the transfer part.

2. The donor substrate for transfer of claim 1, wherein: the intermediate layer comprises a UV curable material.

3. The donor substrate for transfer of claim 2, wherein: the transfer layer comprises an organic light emitting material.

4. The donor substrate for transfer of claim 1, wherein: the transfer part is a region to which light is irradiated in a pattern.

5. The donor substrate for transfer of claim 1, wherein: the light-heat conversion layer is configured to convert light to heat energy.

6. The donor substrate for transfer of claim 1, wherein: the non-transfer part is a region of the intermediate layer where light for inducing the light-heat conversion layer to convert the light to heat energy is not irradiated.

* * * * *